(12) United States Patent
Kilian

(10) Patent No.: US 7,772,661 B2
(45) Date of Patent: Aug. 10, 2010

(54) HALL-EFFECT MAGNETIC SENSORS WITH IMPROVED MAGNETIC RESPONSIVITY AND METHODS FOR MANUFACTURING THE SAME

(75) Inventor: Wayne Kilian, Richardson, TX (US)

(73) Assignee: Honeywell International Inc., Morristown, NJ (US)

(*) Notice: Subject to any disclaimer, the term of this patent is extended or adjusted under 35 U.S.C. 154(b) by 205 days.

(21) Appl. No.: 12/178,144

(22) Filed: Jul. 23, 2008

(65) Prior Publication Data

US 2010/0019331 A1 Jan. 28, 2010

(51) Int. Cl.
- H01L 49/02 (2006.01)
- H01L 27/22 (2006.01)
- H01L 43/04 (2006.01)
- H01L 43/06 (2006.01)

(52) U.S. Cl. ............... 257/421; 257/427; 257/E43.002
(58) Field of Classification Search ................ 257/421, 257/427, E43.002
See application file for complete search history.

(56) References Cited

U.S. PATENT DOCUMENTS

| | | | |
|---|---|---|---|
| 4,521,727 A | 6/1985 | Atherton et al. | 323/294 |
| 4,760,285 A | 7/1988 | Nelson | 307/309 |
| 5,119,166 A | 6/1992 | Sridhar | 357/60 |
| 5,323,075 A | 6/1994 | Denk et al. | 310/68 B |
| 5,528,067 A * | 6/1996 | Farb | 257/401 |
| 5,572,058 A * | 11/1996 | Biard | 257/421 |
| 6,492,697 B1 | 12/2002 | Plagens et al. | 257/426 |
| 7,135,857 B2 | 11/2006 | Johnson | 324/207.2 |
| 7,205,622 B2 * | 4/2007 | Alimi et al. | 257/422 |
| 2003/0094943 A1 * | 5/2003 | Ashley et al. | 324/251 |
| 2005/0230770 A1 | 10/2005 | Oohira | |
| 2005/0280107 A1 | 12/2005 | Cohen | |
| 2006/0157809 A1 | 7/2006 | Alimi et al. | |
| 2009/0206424 A1 * | 8/2009 | Kilian et al. | 257/421 |

FOREIGN PATENT DOCUMENTS

EP 0162165 A3 11/1985

OTHER PUBLICATIONS

International Search Report and Written Opinion from corresponding PCT Application Serial No. PCT/US2009/049872 mailed Feb. 24, 2010 (6 pages).

* cited by examiner

Primary Examiner—Evan Pert
(74) Attorney, Agent, or Firm—Shumaker & Sieffert, P.A.

(57) ABSTRACT

A Hall-effect magnetic sensor comprises a p-type Hall element and an n-type epitaxial Hall element. The p-type element can be implanted directly on top of the n-type element. The merged Hall elements can be biased in parallel to provide a nearly zero-bias depletion layer throughout for isolation. Electrical contacts to the n-type element can be diffused down through the p-type element and positioned to partially obstruct current flow in the p-type element. Electrical contacts can be diffused into the p-type element. Each bias contact of the p-type element can be connected to respective bias contacts of the n-type element in a parallel fashion. Then, an output signal can be taken at the sense contacts of the n-type element in order to provide improved magnetic responsivity. Further provided is a method for manufacturing the Hall-effect magnetic sensor.

20 Claims, 5 Drawing Sheets

HALL-EFFECT MAGNETIC SENSORS WITH IMPROVED MAGNETIC RESPONSIVITY AND METHODS FOR MANUFACTURING THE SAME

TECHNICAL FIELD

Embodiments are generally related to Hall-effect elements. Embodiments are more particularly related to Hall-effect magnetic sensors with Hall-effect elements. Embodiments are also related to methods for manufacturing Hall-effect magnetic sensors.

BACKGROUND OF THE INVENTION

With the development of the semiconductor industry, the application of well-known Hall effect elements can be utilized in various semiconductor devices, in particular Hall-effect sensors. Such integrated Hall-effect sensors can be fabricated in accordance with well-known silicon planar process technology. Integrated Hall-effect sensors can be operated based on what can be referred to in the art as "Hall-effect technology." Such Hall-effect technology can provide solutions for reliable solid-state magnetic switching and linear magnetic sensing. Hall-effect magnetic sensors can convert energy stored in the magnetic field to an electrical signal by means of the Hall-effect in order to sense position of a moveable object. Generally, the Hall-effect can occur when a conductor carrying electrical current is placed in a magnetic field. Integrated Hall-effect sensors can be utilized for automotive, consumer, medical and industrial applications.

Furthermore, the Hall element can be a basic component of the Hall-effect magnetic sensors and supplied by an electrical power source. The Hall element can be constructed from a thin sheet of conductive material with output connections perpendicular to the net direction of electrical current flow. When the magnetic field is applied normal to the plane, approximated as the thin sheet of electrical current flow through the Hall element, an electric field responds to counteract deflection of charge carriers due to the Lorentz force. The counteracting electric field is commonly referred to as the Hall field. The development of the Hall field results from the necessity of charge neutrality in the thin conducting sheet, in a direction perpendicular to the direction of current flow. The Hall field present between the output connections can be measured as a Hall voltage, which can be orthogonal to both the magnetic field and the electrical current flow. Such Hall voltage can be directly proportional to the magnetic field, in particular magnetic responsivity, and can be measured to sense magnetic flux density.

Hall-effect elements can be fabricated using a semiconductor material such as silicon. A Hall-effect element can include two bias contacts and two sensing contacts that can be formed by diffusing impurities into the semiconductor body incorporating a Hall-effect element. Metal conductors can be deposited and patterned on the surface of said semiconductor body to provide electrical connections to the Hall element. The diffused impurities raise the conductivity of the silicon in the localized regions of the contacts to provide ohmic characteristics at the interface of the silicon and the metal interconnects. The high-conductivity diffused regions that facilitate the contacts act approximately as equipotential regions within the bulk of the Hall effect element. The electric field must tend to zero along an equipotential boundary. Accordingly, the Hall field is diminished near the high conductivity diffused regions at the contacts. Deflection of mobile charge carriers occurs, in accordance with the Lorentz force, in the region of diminished Hall field near the contacts. The diminution of the Hall field and consequential deflection of mobile charge carriers in the region of a contact can be referred to as the shorting effect, and can be quantified as the shorting factor in a mathematical description of the Hall voltage. A common technique of prior art is to minimize the area of the contacts in order to minimize the shorting factor, thereby maximizing the Hall voltage.

Hall Offset can be measured as a differential voltage, at the output sensing contacts, in the absence of a magnetic field. Geometrical irregularities in the contact locations and shape can produce Hall offset. Processing tolerances effect the placement accuracy and geometry control of the contacts, so that there is a practical limit to contact size reduction imposed by Hall offset considerations. Ultimately, contact size is chosen on the basis of maximizing the Hall voltage-to-offset ratio.

It is well established in the literature that no particular geometrical shape or contact configuration can improve magnetic responsivity of single-plate Hall elements that are constructed using identical processes and materials. In the prior art, maximization of the Hall voltage-to-offset ratio is limited to reducing the Hall offset through precise control of geometrical symmetry. Other techniques can be applied to reduce Hall offset such as: averaging the output signals of a plurality of Hall elements that are arranged geometrically in a common centroid layout, the use of trimming networks or by averaging output signals obtained with multiple bias configurations; the so called current spinning method.

A need therefore exists for an improved Hall-effect magnetic sensor with higher magnetic responsivity, an improvement which can be provided by a parallel arrangement of two semiconducting layers, one n-type and one p-type, magnetically coupled across a nearly zero-bias depletion region. A nearly zero-bias depletion region herein includes any bias induced depletion layer that does not cause significant diffusion current to pass between the n-type and p-type layers. Such Hall-effect magnetic sensor is described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved Hall-effect magnetic sensor with higher magnetic responsivity.

It is another aspect of the present invention to provide for a method for manufacturing the Hall-effect magnetic sensor.

The aforementioned aspects and other objectives and advantages can now be achieved as described herein. A Hall-effect magnetic sensor comprises a p-type Hall element and an n-type epitaxial Hall element. The p-type element can be implanted directly on top of the n-type element. The merged Hall elements can be biased in parallel to provide a nearly zero-bias depletion layer throughout for isolation. Electrical contacts to the n-type element can be diffused down through the p-type element and positioned to partially obstruct current flow in the p-type element. Bias contacts can be diffused into the p-type element. Power bias contacts of the p-type element can be connected to respective bias contacts of the n-type element in a parallel fashion. Then, an output signal can be taken at the sensor contacts of the n-type element in order to provide improved magnetic responsivity. The invention further provides a method for manufacturing the Hall-effect magnetic sensor.

Furthermore, the Hall-effect magnetic sensor can also include a p-type substrate and be constructed using a standard silicon IC technology. The n-type epitaxial Hall element can be disposed on the p-type substrate. The n-and-p type Hall elements can represent a set of parallel sheets or plates that are connected to an external power source. N-type diffusions can extend through the implanted layer comprised by the p-type Hall element. Such n-type diffusions can be connected as bias terminals to supply electrical power to the n-type Hall element. These n-type diffusions can partially obstruct electrical current flow in the p-type Hall element. Such partial obstruction of current flow in the p-type Hall element can result in enhanced asymmetry of the current-flow lines, about a center line intersecting the bias contacts of the p-type Hall, upon application of an external magnetic field, and resulting from current deflection at the bias contacts of the p-type element, due to the Lorentz force. The output signal voltage of the n-type epitaxial Hall element can be enhanced by magnetic coupling between the parallel sheets of conduction currents. The parallel sheets of the Hall elements can also be formed together with a topology of n-and-p-type Hall element contacts that optimizes the output voltage of the n-type Hall element.

Such Hall-effect magnetic sensor described herein can exhibit better magnetic responsivity in order to achieve higher Hall sensor performance in an optimized manner.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
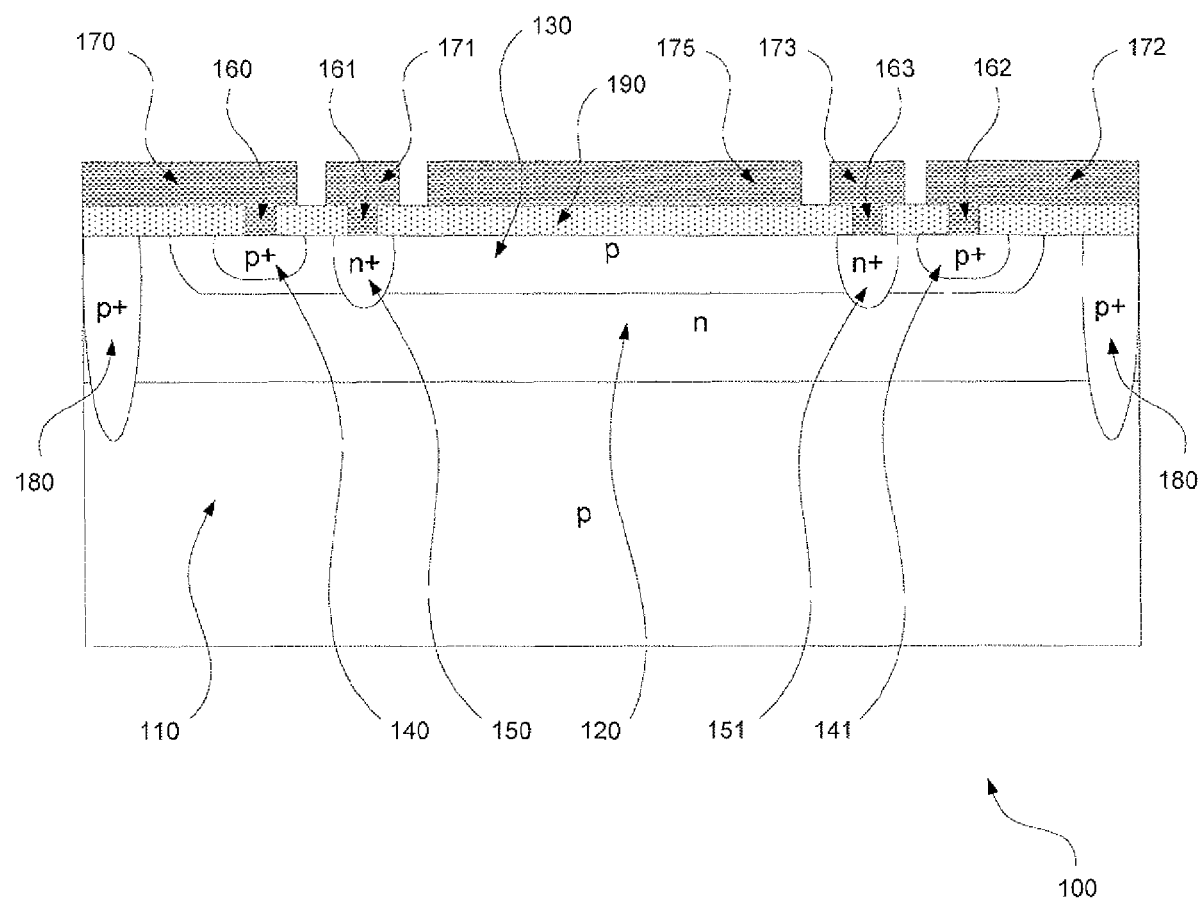
FIG. 1 illustrates a sectional view for a layout of a Hall-effect magnetic sensor with two parallel Hall elements, which can be adapted for use in implementing a preferred embodiment.
Figure 2:
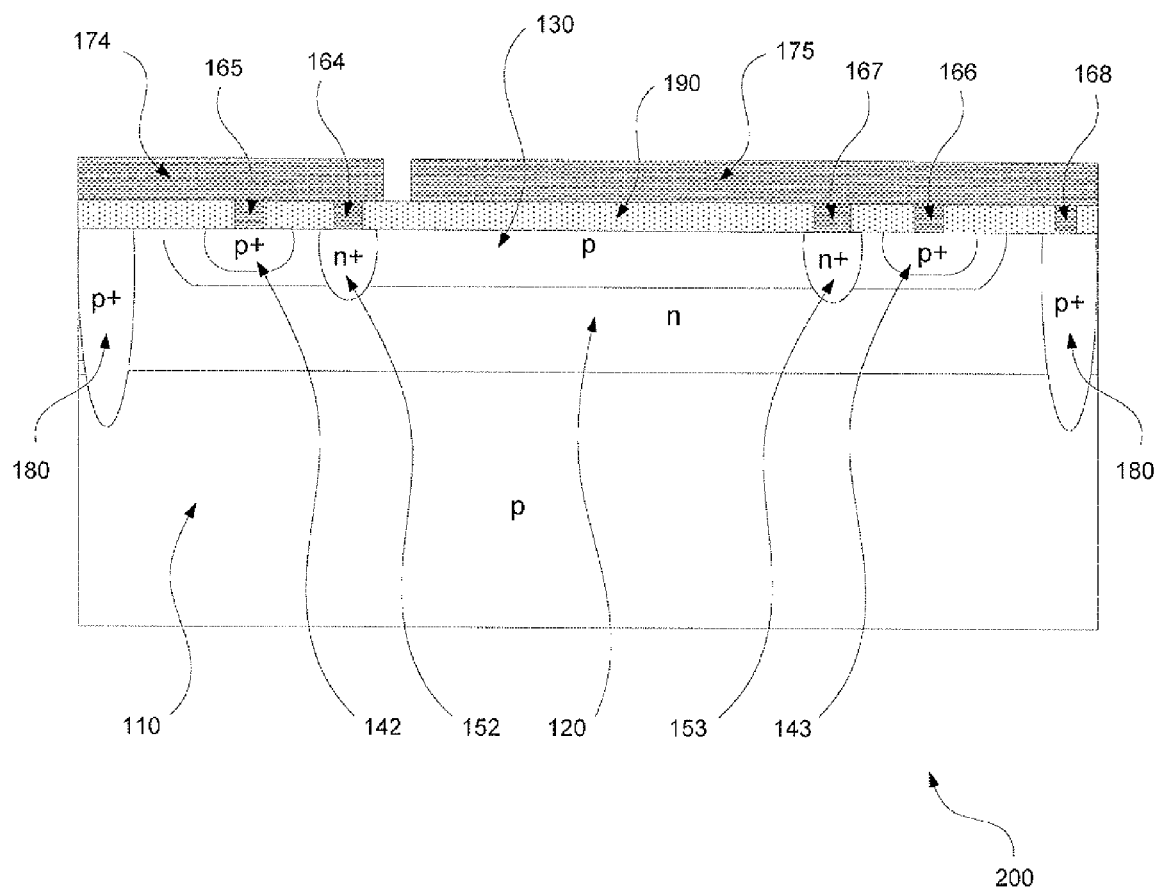
FIG. 2 illustrates a sectional view of the Hall-effect magnetic sensor perpendicular to the sectional view as shown in FIG. 1, which can be implemented in accordance with a preferred embodiment.

FIG. 1 and FIG. 2 represent sectional views (not to scale) of a Hall-effect device with improved magnetic responsivity. These sectional views are depicted at right angle to one another. FIG. 1 illustrates internal structures along a section that passes through the signal output terminals of the n-type and p-type Hall elements. FIG. 2 depicts internal structures along a section that passes through the bias terminals of the n-type and p-type Hall elements. Heavily doped n-type and p-type diffused layers are respectively indicated as n+ and p+ in FIG. 1 and FIG. 2.

Referring to FIG. 1 a sectional view of a Hall-effect device with improved magnetic responsivity 100 is illustrated, which can be implemented in accordance with a preferred embodiment. The Hall-effect device 100 can be formed on a semiconductor body made of silicon, utilizing silicon integrated circuit technology. A p-type substrate 110 can be formed as a base for the Hall-effect magnetic device 100. The Hall-effect device 100 generally includes a p-type substrate layer 110 upon which an epitaxial layer or an n-type Hall element 120 can be formed. A p-type layer or a p-type Hall element 130 can be implanted directly on top of the n-type epitaxial Hall element 120.

An isolating layer 180 bounds the entire perimeter of the n-type epitaxial Hall element 120 and surrounds the p-type Hall element 130. The isolating layer 180 is preferably p-type silicon, and the n-type Hall element 120 is preferably formed within a region of an n-type epitaxial silicon layer that can be grown on the p-type substrate 110. The isolating layer 180 can be formed by diffusing p-type impurities extending down through the n-type epitaxial layer and into the p-type substrate 110 and can provide electrical isolation. The isolating layer 180 can be biased with a negative voltage potential with respect to the n-type Hall element 120 to isolate Hall elements 120 and 130 from other circuit elements. Additionally, an insulating layer 190 can be formed above the n-type epitaxial layer 120. The insulating layer 190 can be for example, silicon dioxide.

An electrically conductive material can be formed on top of the insulating layer 190. The conductive layer can be for example, mostly aluminum or polysilicon. The conductive layer can be partitioned into separate regions 170, 171, 172, 173 and 175, configured to provide electrical interconnection to the Hall Effect device 100. The insulating layer 190 can be selectively removed to respectively configure electrical contacts 160, 161, 162 and 163 between interconnection conductors 170, 171, 172 and 173 and the underlying silicon layers 140, 141, 150, 151. Silicon layers 150 and 151 can be formed from heavily doped n-type diffusions to support ohmic conduction between the n-type Hall element 120 and conductors 171 and 173.

Silicon layers 140 and 141 can be formed from heavily doped p-type diffusions to support ohmic conduction between the p-type Hall element 130 and conductors 170 and 172. Conductors 171 and 173 can be used to connect the n-type Hall element differential output signal to an electrical circuit. In one embodiment, conductors 170 and 172 can be electrically isolated or floating. In an alternate embodiment, conductors 170 and 172 can be used to connect the p-type Hall element differential output signal to an electrical circuit, to provide modulation of the n-type Hall element differential output signal. For example, and electrical signal applied to conductors 171 and 172 can be used to null the offset voltage of the n-type Hall element. Electrical connections from conductor 175 to the silicon under layers are not apparent in this sectional view.

Referring to FIG. 2 a sectional view of a Hall-effect device with improved magnetic responsivity 200 is illustrated, which can be implemented in accordance with a preferred embodiment. Descriptions of the p-type substrate layer 110, epitaxial layer comprising the n-type Hall element 120, p-type implanted layer 130 and isolation diffusion 180 are as in the detailed description of FIG. 1. An insulating layer 190 can be formed above the n-type epitaxial layer. The insulating layer 190 can be for example, silicon dioxide.

An electrically conductive material can be formed on top of the insulating layer 190. The conductive layer can be for example, mostly aluminum or polysilicon. The conductive layer can be partitioned into separate regions 174 and 175, configured to provide electrical connection to the n-type and p-type Hall elements. The insulating layer 190 can be selectively removed to configure electrical contacts 164 and 165 between conductor 174 and the underlying silicon layers 152 and 142. Additionally, insulating layer 190 can be selectively removed to configure electrical contacts 166, 167 and 168 between conductor 175 and the underlying silicon layers 143, 153 and 180.

Silicon layers 152 and 153 can be formed from heavily doped n-type diffusions to support ohmic conduction between the n-type Hall element 120 and conductors 174 and 175. Silicon layers 142 and 143 can be formed from heavily doped p-type diffusions to support ohmic conduction between the p-type Hall element 130 and conductors 174 and 175. Conductors 174 and 175 can be used to connect the n-type and p-type Hall elements to an external power source. Silicon layer 180 can be formed from a heavily doped p-type diffusion to support ohmic conduction to conductor 175. Reverse bias can be provided across the n-type epitaxial layer and the p-type isolating layer to provide electrical isolation; conductor 174 can be biased at a voltage potential that is positive with respect to conductor 175 to isolate the two Hall elements 120 and 130 from other circuit elements.

Sufficient electrical isolation between the n-type and p-type Hall elements 120 and 130 can be achieved by arranging bias connection conductors 174 and 175 to power the n-type and p-type Hall elements in parallel. This parallel bias configuration produces a nearly zero-bias depletion region between the n-type and p-type Hall elements.

Figure 3:
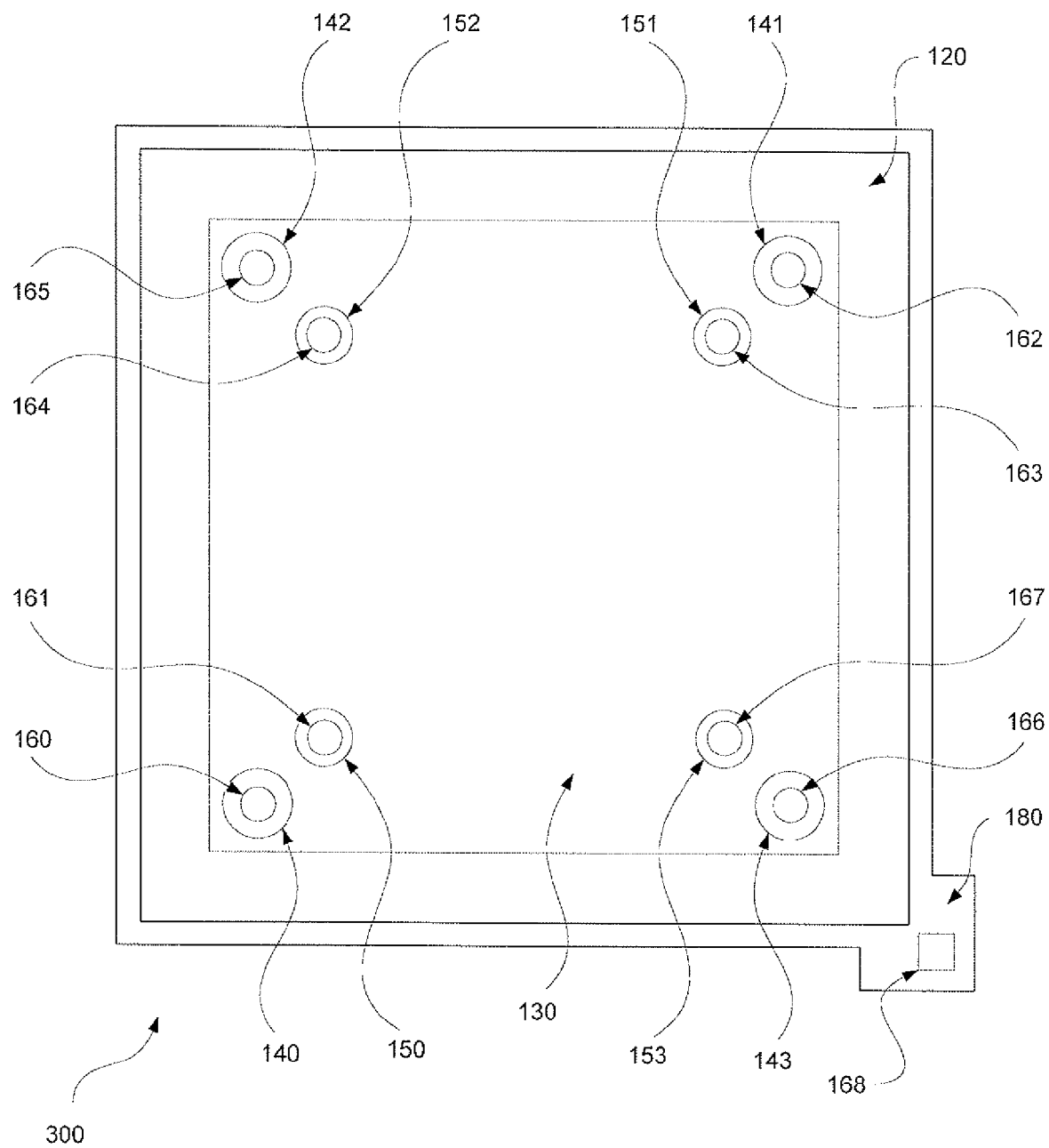
FIG. 3 illustrates a top view of the Hall-effect magnetic sensor with electrical contacts, which can be implemented in accordance with a preferred embodiment.

Referring to FIG. 3 a schematic top view of Hall-effect device 300 with improved magnetic responsivity is illustrated, which can be implemented in accordance with a preferred embodiment. Descriptions of the epitaxial layer comprising the n-type Hall element 120, the p-type implanted layer 130, p-type diffusions 140, 141, 142 and 143, n-type diffusions 150, 151, 152, and 153, contact openings 160, 161, 162, 163, 164, 165, 166, 167 and 168, and isolation diffusion 180 are as in the detailed description of FIG. 1 and FIG. 2. The sectional view in FIG. 1 relates to a section from the lower left-hand corner to the upper right-hand corner of Hall device 300 in FIG. 3. The sectional view in FIG. 2 relates to a section from the upper left-hand corner to the lower right-hand corner of Hall device 300 in FIG. 3.

Figure 4:
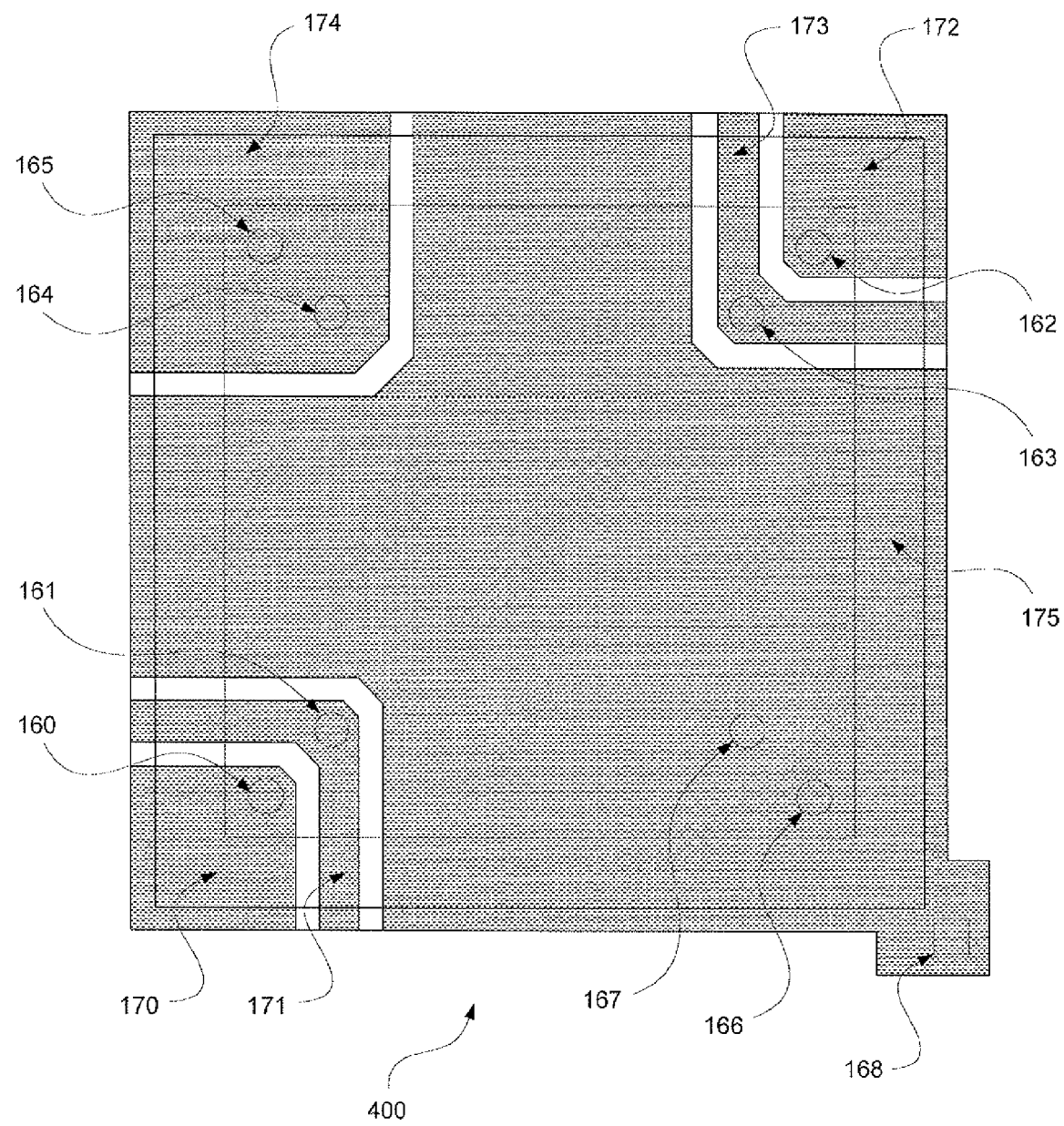
FIG. 4 illustrates a top view of the Hall-effect magnetic sensor with electrical contacts and interconnecting conductors, which can be implemented in accordance with a preferred embodiment.

FIG. 4 illustrates an alternative schematic view of Hall-effect device 400 with improved magnetic responsivity in accordance with a preferred embodiment. Descriptions of the contact openings 160, 161, 162, 163, 164, 165, 166, 167 and 168, and conductors 170, 171, 172, 173 and 174 are as in the detailed description of FIG. 1 and FIG. 2. Interconnection conductor 175 can connect the two merged Hall elements and the isolating diffusion (see component 180 in FIG. 1-FIG. 3) to the low-potential side of an external power source through contact openings 166, 167 and 168. Conductor 175 can also cover the surface area of Hall device 100 that is not covered by conductors 170, 171, 172, 173 and 174, to act as a field plate. Substantial surface accumulation and depletion layers can exist in lightly doped silicon layers at the silicon-insulator interface, in response to electric fields. In particular, the n-type epitaxial layer and to a lesser degree the implanted p-type layer (i.e., components 120 and 130 respectively depicted in FIG. 1-FIG. 3) are susceptible to modulation of sheet conductivity due to these field induced surface layers.

In the presence of locally non-uniform fields, the resulting local variation in sheet conductivity can produce error signals at the output of either the n-type or p-type Hall elements. Conductor 175 is configured to guard the underlying layers from external electric fields, thereby controlling the error signals. The field effects that remain, due to charges in the insulating layer (i.e., see component 190 in FIG. 1-FIG. 2) and work function differences between the silicon and conductor 175, are mainly uniform and so produce only small, relatively stable offset signals from the Hall elements.

Figure 5:
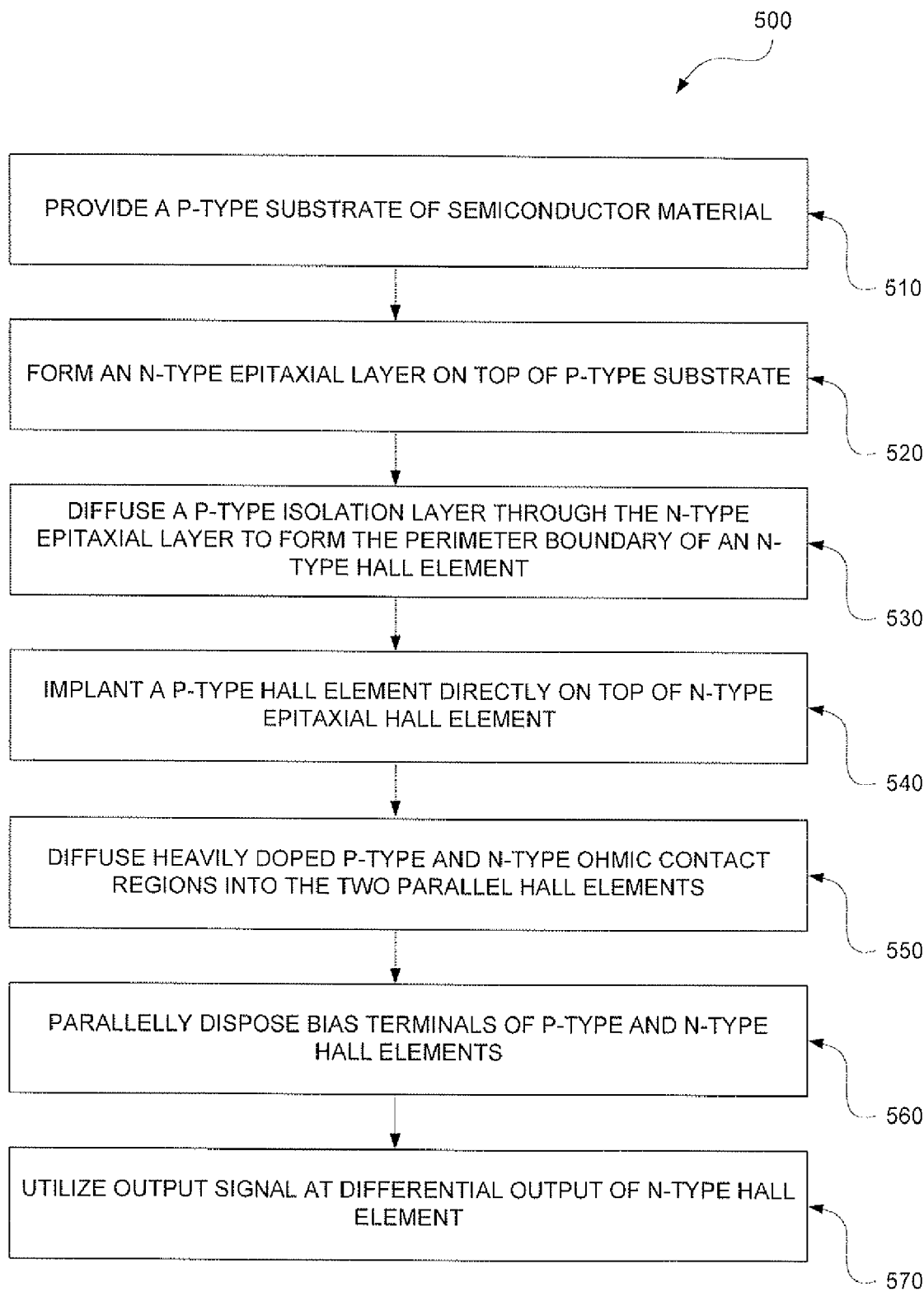
FIG. 5 illustrates a flowchart of a method for manufacturing the Hail-effect magnetic sensor as shown in FIG. 1, which can be implemented in accordance with a preferred embodiment.

Referring to FIG. 5, a detailed flow chart of operations illustrating logical operational steps of a method 500 for constructing the Hall-effect device 100 with merged complementary structure is illustrated, which can be implemented in accordance with a preferred embodiment. Note that in FIGS. 1-4, identical or similar parts or elements are generally indicated by identical reference numerals. As indicated at block 510, a p-type substrate can be provided, and at block 520 an n-type epitaxial layer can be formed upon the p-type substrate. Such n-type epitaxial Hall element 120 can be formed of thin n-doped epitaxial layer. As indicated in block 530, a p-type layer can be diffused down through the n-type epitaxial layer to provide for electrical isolation of an area of the epitaxial layer that forms the n-type Hall element 120. Next, as depicted at block 540, a p-type hall element 130 can be implanted directly on top of n-type epitaxial hall element 120. Similarly, the p-type Hall element 130 can be formed of a thin p-type implanted layer.

As specified at block 550, electrical contact regions 140-143 to the p-type Hall element 130 and electrical contact regions 150-153 to the n-type epitaxial Hall element 120 can be diffused. The diffusions can be made by doping appropriate n-type and p-type impurities into the n-type epitaxial layer and the thin p-type implanted layer.

n-type contacts 150-153 to the n-type Hall element 120 can be diffused down through the p-type Hall element 130 and positioned to partially obstruct current flow in the p-type Hall element 130. As displayed at block 560, the merged Hall elements 120 and 130 can be biased in parallel to provide a nearly zero-bias depletion layer between Hall elements 120 and 130. The nearly zero-bias depletion layer can provide isolation between the p-type Hall element 130 and the n-type epitaxial Hall element 120. Finally, as indicated at block 570, a differential output voltage signal can be measured at the output terminals 171 and 173 of the n-type epitaxial Hall element 120. The present invention can provide the Hall-effect magnetic sensor 100, 200, 300 and/or 400 that is capable of precisely measuring a magnetic field in accordance with the Hall effect. In addition, such design optimizations of the Hall-effect magnetic sensor 100, 200, 300 and/or 400 can improve magnetic responsivity for achieving higher performance.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A Hall-effect magnetic sensor with improved magnetic responsivity, comprising:

a p-type semiconductor substrate comprising a semiconductor material such as silicon;

an n-type epitaxial Hall element disposed on top of said p-type semiconductor substrate in accordance with standard silicon integrated circuit (IC) fabrication technology, wherein said n-type epitaxial Hall element comprises a thin n-type epitaxial layer; and a p-type Hall element with a thin p-type layer implanted directly on top of said n-type epitaxial Hall element in order to improve magnetic responsivity, wherein said n-type epitaxial Hall element and said p-type Hall element are biased in parallel to provide a nearly zero-bias depletion layer throughout for isolation between said n-type epitaxial Hall element and said p-type Hall element.

2. The sensor of claim 1, further comprising:

an insulating layer formed on top of said p-type Hall element, wherein said insulating layer comprises silicon dioxide (SiO2); and an electrically conductive layer disposed on said insulating layer, wherein said electrically conductive layer acts as external electrical connections.

3. The sensor of claim 1 wherein each Hall element comprises a plurality of bias contacts and a plurality of sense contacts.

4. The sensor of claim 1 wherein said plurality of bias and sense contacts in said n-type epitaxial Hall element are diffused down through said p-type element.

5. The sensor of claim 1 wherein said plurality of bias and sense contacts in said n-type epitaxial Hall element are further positioned to partially obstruct current flow in said p-type Hall element.

6. The sensor of claim 1 wherein said plurality of bias and sense contacts in said p-type epitaxial Hall element are diffused into said p-type element.

7. The sensor of claim 1 wherein said plurality of bias contacts comprises a voltage contact and a ground contact.

8. The sensor of claim 1 wherein said plurality of bias contacts of said p-type Hall element is electrically connected to said plurality of bias contacts of said n-type epitaxial Hall element in a parallel fashion.

9. The sensor of claim 1 wherein said plurality of bias contacts and said plurality of sense contacts of each Hall element are substantially coupled to a plurality of conductors to provide electrical connections.

10. A Hall-effect magnetic sensor with improved magnetic responsivity, comprising:

a p-type semiconductor substrate comprising a semiconductor material such as silicon;

an n-type epitaxial Hall element disposed on top of said p-type semiconductor substrate in accordance with standard silicon integrated circuit (IC) fabrication technology, wherein said n-type epitaxial Hall element comprises a thin n-type epitaxial layer;

a p-type Hall element with a thin p-type layer implanted directly on top of said n-type epitaxial Hall element in order to improve magnetic responsivity, wherein said n-type epitaxial Hall element and said p-type Hall element are biased in parallel to provide a nearly zero-bias depletion layer throughout for isolation between said n-type epitaxial Hall element and said p-type Hall element; and an insulating layer formed on top of said p-type Hall element, wherein said insulating layer comprises silicon dioxide (SiO2).

11. The sensor of claim 10 including an electrically conductive layer disposed on said insulating layer, wherein said electrically conductive layer acts as external electrical connections.

12. The sensor of claim 10 wherein each Hall element comprises a plurality of bias contacts and a plurality of sense contacts.

13. The sensor of claim 10 wherein said plurality of bias and sense contacts in said n-type epitaxial Hall element are diffused down through said p-type element.

14. The sensor of claim 10 wherein said plurality of bias and sense contacts in said n-type epitaxial Hall element are further positioned to partially obstruct current flow in said p-type Hall element.

15. The sensor of claim 10 wherein said plurality of bias and sense contacts in said p-type epitaxial Hall element are diffused into said p-type element.

16. The sensor of claim 10 wherein said plurality of bias contacts comprises a voltage contact and a ground contact.

17. The sensor of claim 10 wherein said plurality of bias contacts of said p-type Hall element is electrically connected to said plurality of bias contacts of said n-type epitaxial Hall element in a parallel fashion.

18. The sensor of claim 10 wherein said plurality of bias contacts and said plurality of sense contacts of each Hall element are substantially coupled to a plurality of conductors to provide electrical connections.

19. A Hall-effect magnetic sensor with improved magnetic responsivity, comprising:

a p-type semiconductor substrate comprising a semiconductor material such as silicon;

an n-type epitaxial Hall element disposed on top of said p-type semiconductor substrate in accordance with standard silicon integrated circuit (IC) fabrication technology, wherein said n-type epitaxial Hall element comprises a thin n-doped epitaxial layer;

a p-type Hall element with a thin p-type layer implanted directly on top of said n-type epitaxial Hall element in order to improve magnetic responsivity, wherein said n-type epitaxial Hall element and said p-type Hall element are biased in parallel to provide a nearly zero-bias depletion layer throughout for isolation between said n-type epitaxial Hall element and said p-type Hall element; and an insulating layer formed on top of said p-type Hall element, wherein said insulating layer comprises silicon dioxide (SiO2).

20. The sensor of claim 19 including an electrically conductive layer disposed on said insulating layer, wherein said electrically conductive layer acts as external electrical connections.

* * * * *